(12) United States Patent
Sato et al.

(10) Patent No.: US 11,090,917 B2
(45) Date of Patent: Aug. 17, 2021

(54) LAMINATE AND METHOD FOR FABRICATING THE SAME

(71) Applicant: TOPPAN PRINTING CO., LTD., Tokyo (JP)

(72) Inventors: Jin Sato, Tokyo (JP); Mitsuru Kano, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/730,922

(22) Filed: Oct. 12, 2017

(65) Prior Publication Data

US 2018/0037017 A1 Feb. 8, 2018

Related U.S. Application Data

(63) Continuation of application No. PCT/JP2016/002037, filed on Apr. 15, 2016.

(30) Foreign Application Priority Data

Apr. 17, 2015 (JP) .............................. JP2015-085116

(51) Int. Cl.
*B32B 37/02* (2006.01)
*B32B 9/00* (2006.01)
(Continued)

(52) U.S. Cl.
CPC .............. *B32B 37/02* (2013.01); *B32B 9/00* (2013.01); *B32B 27/06* (2013.01); *B32B 27/281* (2013.01);
(Continued)

(58) Field of Classification Search
CPC ....... B32B 37/02; B32B 27/06; B32B 27/281; B32B 9/00; C23C 16/0245; C23C 16/545;
(Continued)

(56) References Cited

U.S. PATENT DOCUMENTS 6,730,614 B1 * 5/2004 Lim ...................... C23C 16/452
257/E21.171
2003/0203210 A1 * 10/2003 Graff ................... H01L 51/0097
428/412
(Continued)

FOREIGN PATENT DOCUMENTS

EP 2011898 A1 * 1/2009 ........... C23C 16/403
JP 2003-327718 11/2003
(Continued)

OTHER PUBLICATIONS

International Search Report Issued in International Application No. PCT/JP2016/002037 dated Jul. 19, 2016.
(Continued)

*Primary Examiner* — Michael P Wieczorek
*Assistant Examiner* — Michael G Miller
(74) *Attorney, Agent, or Firm* — Foley & Lardner LLP (57) ABSTRACT

A laminate includes a substrate made of an organic polymer having a functional group containing an oxygen atom or a nitrogen atom, a functional layer bonded to the functional group of the organic polymer contained in the substrate and formed by an atomic layer deposition process, and an overcoat layer provided to cover the functional layer and containing transition metal atoms. Because the adhesion between the substrate and the functional layer is improved and the functional layer is protected by the overcoat layer, it is possible to achieve both improved gas barrier properties and/or improved durability against an environmental stress such as heat, humidity and the like.

6 Claims, 3 Drawing Sheets

(51) Int. Cl.
*C23C 16/54* (2006.01)
*C23C 16/02* (2006.01)
*C23C 16/455* (2006.01)
*C23C 16/40* (2006.01)
*B32B 27/06* (2006.01)
*B32B 27/28* (2006.01)
*C23C 14/08* (2006.01)
*C23C 28/04* (2006.01)
*H01L 51/52* (2006.01)

(52) U.S. Cl.
CPC ........ *C23C 14/083* (2013.01); *C23C 16/0245* (2013.01); *C23C 16/403* (2013.01); *C23C 16/45542* (2013.01); *C23C 16/45553* (2013.01); *C23C 16/45555* (2013.01); *C23C 16/545* (2013.01); *B32B 2255/205* (2013.01); *B32B 2379/08* (2013.01); *B32B 2457/14* (2013.01); *B32B 2457/202* (2013.01); *B32B 2553/00* (2013.01); *C23C 28/042* (2013.01); *H01L 51/5253* (2013.01)

(58) Field of Classification Search
CPC ............ C23C 16/45542; C23C 16/403; C23C 16/45553; C23C 16/45555; C23C 14/083
USPC .............................. 427/248.1–255.7, 569–579
See application file for complete search history.

(56) References Cited

U.S. PATENT DOCUMENTS

| | | | |
|---|---|---|---|
| 2005/0112874 A1 | 5/2005 | Skarp et al. | |
| 2008/0102313 A1* | 5/2008 | Nilsen | C23C 16/45525 428/704 |
| 2013/0337259 A1* | 12/2013 | Garcia | C09D 5/00 428/336 |
| 2016/0009942 A1* | 1/2016 | Horiike | C23C 16/45555 428/216 |

FOREIGN PATENT DOCUMENTS

| | | |
|---|---|---|
| JP | 2005-104026 | 4/2005 |
| JP | 2007-516347 | 6/2007 |
| JP | 2011-255611 | 12/2011 |
| JP | 2012-116151 | 6/2012 |
| WO | WO-2013/035689 | 3/2013 |
| WO | WO-2014/156888 | 10/2014 |
| WO | WO-2014/156932 | 10/2014 |
| WO | WO-2014156888 A1 * | 10/2014 ........... C23C 16/403 |

OTHER PUBLICATIONS

Partial European Search Report dated Dec. 14, 2018 in corresponding application No. 16779780.2.
Seo et al, Optimization of Al2O3/ZrO2 nanolaminate structure for thin-film encapsulation of OLEDS's, Organic Electronics, 2012, pp. 2436-2441.
Han et al, AL2O3/TiO2 multilayer thin films grown by plasma enhanced atomic layer deposition for organic light-emitting diode passivation, Thin Solid Films, 2014, pp. 155-158.
Dameron et al, Gas Diffusion Barriers on Polymers Using Multilayers Fabricated bt Al2O3 and Rapid SiO2 Atmoic Layer Deposition, J. Phys. Chem, 2008, pp. 2573-4580.

* cited by examiner

LAMINATE AND METHOD FOR FABRICATING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2016/002037, filed on Apr. 15, 2016, which is based upon and claims the benefit of priority of Japanese Patent Application No. 2015-085116, filed on Apr. 17, 2015, the entireties of which are hereby incorporated by reference.

TECHNICAL FIELD

The present invention relates to a laminate having an atomic layer deposition film and an inorganic component-containing film formed on the outer surface thereof in this order and a method for fabricating the same.

BACKGROUND

The formation of a thin film deposited, on the surface of a material, from a vapor phase wherein a substance is in a state of moving at the atomic or molecular level like a gas can be broadly classified into a chemical vapor deposition method (CVD: Chemical Vapor Deposition) and a physical vapor deposition method (PVD: Physical Vapor Deposition). Typical of PVD is a vacuum deposition method, a sputtering method or the like. Especially, although generally being high in apparatus cost, the sputtering method enables the formation of a thin film of high quality that is excellent in film quality and the uniformity of film thickness, resulting in wide applications to display devices such as liquid crystal displays.

CVD is one wherein a starting gas or gases are introduced into a vacuum chamber, after which one or two or more gases are decomposed or reacted on a substrate by application of a thermal energy to permit a solid thin film to be grown. In order to promote the reaction upon the film formation or lower the reaction temperature, those using a plasma and a catalytic (catalyst) reaction are, respectively, called PECVD (plasma enhanced CVD) and Cat-CVD. Such CVDs have a feature that the film formation defects are small in number and can thus be applied mainly to the step of producing a semiconductor device such as the formation of a gate insulating film.

In recent years, attention has been paid to an atomic layer deposition process (ALD process: atomic layer deposition). This ALD process is one wherein a substance adsorbed on a surface is formed into a film by layer-by-layer growth at an atomic level through chemical reaction on the surface, and is classified as a category of CVD. It will be noted the distinction between the ALD process and ordinary CVD resides in that while the ordinary CVD is a film formation process wherein a film is grown by subjecting a single gas or a plurality of gases used simultaneously to reaction prior to arrival to a substrate, the ALD process is a specific type of film formation process wherein a gas, which is called a precursor (e.g. TMA: tri-methyl aluminum), i.e. a precursor and which is thus very active, is adsorbed on a substrate surface, followed by reaction between a reactive gas (which is also called precursor in ALD) and the adsorbed precursor to allow a thin film to be grown layer-by-layer at an atomic level.

The specific film formation by the ALD process makes use of a so-called self-limiting effect wherein when a substrate surface is covered with an adsorbed precursor, more adsorption of the gas does not occur, under which an unreacted precursor is exhausted in a state of the precursor being adsorbed only by one layer. Subsequently, a reactive gas is introduced to oxidize or reduce the precursor to obtain one layer of the thin film having a desired composition, followed by exhausting the reactive gas. Such treatments are taken as one cycle, and such a cycle is repeated to grow the thin film. Accordingly, the thin film is grown two-dimensionally in the ALD process. When comparing not only with conventional vacuum deposition process and sputtering, but also with ordinary CVDs, the ALD process is characterized in that the film formation defects are small in number. Hence, the ALD process has been expected to have applications in wide fields including packaging fields such as of foods and medical products and fields of electronic parts.

The ALD processes include a process wherein in the step of reacting a second precursor decomposed with a first precursor adsorbed on a substrate, a plasma is used to activate the reaction. This process is called plasma-enhanced ALD (PEALD: plasma enhanced ALD), or merely plasma ALD.

The technique itself of the ALD process has been proposed by Dr. Tuomo Suntola of Finland in 1974. Generally, a high-quality and high-density film can be obtained by the ALD process, for which applications in the field of semiconductors such as a gate insulating film have been in progress and are, in fact, described in ITRS (International Technology Roadmap for Semiconductors). The ALD process has such a feature that there is no shadow effect (i.e. a phenomenon of causing a film-formation variation due to the film-forming particles entering obliquely relative to a substrate surface) in comparison with other film formation processes. Accordingly, the ALD process is able to form a film if there is an interstitial space into which a gas can be entered. Thus, the ALD process has been expected to be applied not only to the coating of a line or hole on a substrate having such a high aspect ratio that a ratio between depth and width is large, but also to MEMS (micro electro mechanical systems) and the like in coating applications of three-dimensional structures.

Using such a film formation process as stated above, an object to be formed with a thin film by the ALD process exists diversely. For instance, an object to be formed with a thin film by the ALD process exists in a small-sized, plate-shaped substrate such as a wafer or photomask, a non-flexible substrate of large area such as a glass plate, or a flexible substrate of large area such as a film. As to the mass-production facilities for forming a thin film on these substrates in response to these applications, a variety of methods of handling substrates have been proposed depending on the cost, the ease in handling, the quality of formed film and the like and put into practice.

For example, there are single wafer film-forming apparatuses wherein with a wafer, one substrate is fed to a film-forming apparatus to form a film thereon, followed by changing to a next substrate and performing film formation again, and a batchwise film-forming apparatus wherein a plurality of substrates are set in position and the same film formation is performed on all the wafers.

With an instance, wherein film formation is carried out such as on a glass substrate, an in-line film formation apparatus is known wherein substrates are, respectively, formed with a film simultaneously with sequential transfer to a portion serving as a film-forming source. Moreover, there is a web coating film formation apparatus using a roll-to-roll process wherein with regard mainly to a flexible substrate, the substrate is wound off from a roll and formed with a film thereon while transferring, and is rewound on another roll. There is included, in the latter apparatus, such a web coating film formation apparatus that continuous film formation is performed not only for a flexible substrate, but also such a flexible sheet as to allow continuous transfer of a substrate serving as an object to be formed with a film thereon or such a sheet placed on such a tray as to allow flexibility at a part thereof.

With respect to the film-forming methods and the substrate handling methods using any of the film-forming apparatus, when judging from the costs, the product quality and the ease in handling, a combination of film-forming apparatus whose film-forming rates are fastest have been adopted.

It will be noted that an associated technology is disclosed including a technique of forming a gas-permeable barrier layer on a plastic substrate or a glass substrate by carrying out atomic layer deposition by the ALD process (e.g. see Patent Literature 1). According to this technique, a light-emitting polymer is disposed on a flexible, light-permeable plastic substrate and subjected to atomic layer deposition by the ALD process on the surface and side faces of the light-emitting polymer. This permits the coating defects to be reduced in number, and there can be realized a light-permeable barrier film whose gas transmission can be reduced by far in a thickness of several tens of nanometers.

In recent years, for example, barrier films have been demanded for the purpose of flexibilization and lightweighing of the back and front sheets of solar cells and organic EL devices. Moreover, as to the durability of a barrier film against the temperature and humidity, there are required durabilities determined not only by a conventional 85 C.° C./85% R.H. high temperature and high humidity test, but also by a PCT (Pressure Cooker Test: 105° C./100% R.H.) accelerated test.

The formation of a functional layer on a flexible substrate is required like such a barrier film as described above. Usually, a flexible functional film is such that a metal or metal oxide film is formed on at least one surface of a substrate by a CVD process, a sputtering process or a sol-gel process. However, since the substrate is made of an organic polymer film, its surface is more irregular than a wafer or a photomask used in the field of semiconductors. Because of the irregular structure, difficulty is involved in the formation of a stable film and the preservation of the stable film. For example, when subjected to exposure to an environmental stress such as of a high heat and high humidity in a reliability test of a product making use of such a substrate, the film is deteriorated by exposure of the metal-containing film formed on the substrate to steam, thereby resulting in the lowering of adhesion in some cases. Therefore, the resulting laminate may not maintain desired characteristics thereof.

To avoid this problem, there is disclosed a technique, for example, of securing a heat resistance by forming a primer layer made of an organic polymer between a substrate and a functional layer (e.g. see Patent Literature 2). With the case of this technique, however, since the functional layer is formed on the primer layer, difficulty is involved in keeping the functionality due to the direct exposure of the function layer to water vapor in the durability test.

In Patent Literature 3, there is disclosed a technique of forming an underlying layer made of a UV-cured resin so as to improve the surface flatness sufficient to form a sputtered layer for the purpose of improving the film quality of the sputtered layer. The function layer is likewise exposed directly to water vapor in the durability test, so that it is difficult to keep the functionality. Accordingly, it is needed to form, on the functional layer, an overcoat (OC) layer capable of protecting the functional layer.

As in Patent Literature 4, there is disclosed a technique of improving the durability of a laminate film by forming, on an inorganic thin film layer, an OC layer made of an organic compound. When subjected to a severe durability test such as an accelerated life test, the organic compound used for the OC layer deteriorates, thus making it difficult to maintain the function thereof. Moreover, since the inorganic thin film layer having a gas barrier function is formed by use of a conventional PVD process or a CVD process, difficulty is involved in securing a high barrier function.

CITATION LIST

Patent Literature

PTL 1: JP 2007-516347 A
PTL 2: JP 2003-327718 A
PTL 3: JP 2012-116151 A
PTL 4: JP 2005-104026 A

SUMMARY OF THE INVENTION

Technical Problem

As stated above, there have been hitherto widely known such laminates that are provided with a functional film on the outer surface of a substrate made of an organic polymer according to a physical vapor phase growth method or a chemical vapor phase growth method. These laminates are used in flexible films capable of developing such a function as of a gas barrier film having gas barrier properties. Where a functional layer is formed on a substrate made of an organic polymer according to the above-mentioned vapor deposition method or a sputtering method, particles or lumps in the form of clusters having a desired composition arrive at the substrate to form nuclei, thereby leading to film formation. Accordingly, some interstices are formed among the particles forming the film and a dense film cannot be formed. For example, when use is made as a film having gas barrier properties, there arises a problem that satisfactory gas barrier properties cannot be secured.

When a layer, such as a primer layer, for improving the film quality of a functional layer is provided between the functional layer and a polymer substrate so as to improve an environmental stress resistance of the functional layer, the resistance of the functional layer itself can be improved. However, since the functional layer is exposed directly to high temperature steam when subjected to a resistance test, it is difficult to avoid deterioration even with the film improved in the resistance.

Therefore, the present invention has for its object the provision of a laminate having improved or even excellent durability and gas barrier properties and a method for fabricating the same.

Solution to Problem

The inventors of the present invention have found that when a functional layer is formed on a substrate made of an organic polymer according to an atomic layer deposition method and an overcoat layer made of an inorganic film containing transition metal atoms is formed to cover the functional layer therewith, the functional deterioration, due to an environmental stress, determined by a resistance test can be suppressed and the characteristics obtained are more improved or even excellent than those of a functional layer alone formed by the atomic layer deposition method.

More particularly, a laminate of the present invention includes a substrate containing an organic polymer having an oxygen atom or nitrogen atom-containing functional group, a functional layer formed on at least a part of a surface of the substrate and made of an atomic layer deposition film that is bonded to the functional group existing on the surface of the substrate, and an overcoat layer formed on the functional group and made of an inorganic film containing transition metal atoms.

A method for fabricating a laminate according to the present invention is to fabricate a laminate having a functional layer and an overcoat layer stacked in this order on a substrate containing an organic polymer having an oxygen atom or nitrogen atom-containing functional group, the method comprising the precursor feeding step of feeding a precursor starting material for the functional layer on a surface of the substrate, the purging step of removing a precursor material, not bonded to the surface of the substrate, by use of an inert gas, the functional layer forming step of forming a functional layer made of atomic layer deposition films by repeating a reaction step of reacting the precursor material bonded to the surface of the substrate by plasma excitation of an oxidative gas, and the overcoat layer forming step of forming, on the functional layer, an overcoat layer made of a transition metal atom-containing inorganic film by a physical gas phase growth method or a chemical gas phase growth method.

Advantageous Effects of the Invention

According to the present invention, there can be provided a laminate having improved or even excellent durability and gas barrier properties and also a method for fabricating the same.

DESCRIPTION OF REPRESENTATIVE EMBODIMENTS

The preferred embodiments of the invention will be described below in detail with reference to the drawings. Note that, in the drawings, the same or equivalent components are represented by the same reference numerals, and overlapping descriptions will be omitted. Further, although the description has been made with reference to a limited number of embodiments, the scope of the invention is not limited thereto, and modifications of the above embodiments on the basis of the above disclosure is obvious to a person having ordinary skill in the art. That is, the present invention may not be limited to the aforementioned embodiments. Design modifications or the like can also be made to the above embodiments on the basis of a knowledge of a skilled person in the art, and such modifications or the like without departing from the principle of the present invention are encompassed within the scope of the present invention.

SUMMARY OF EMBODIMENTS

The laminate related to the present invention is one which has a functional layer formed by an atomic layer deposition method and an overcoat layer made of an inorganic material stacked on a substrate made of an organic polymer in this order. The overcoat layer is a film formed by a sputtering process, a CVD process or a vacuum deposition process and is formed of a transition metal atom-containing inorganic film, so that the surface of the laminate can be protected with a chemically stable material.

The formation of the overcoat layer on the functional layer enables the resulting laminate to have more improved or even excellent characteristics than with the case of the functional layer alone.

<Approach to the Present Invention>

As to the laminate provided with the atomic layer deposition film (ALD film) prepared by an atomic layer deposition process (ALD process), commercial production has now been performed for use as electronic part substrates, such as a glass substrate, a silicon substrate and the like, in thin film inorganic ELs, displays, semiconductor memories (DRAM) and the like. On the other hand, a substrate of a laminate, to which the present invention is directed, is made of an organic polymer, for which there may be some cases where adsorption sites on which the precursor can be adsorbed may not be present sufficiently unlike a glass substrate or a silicon substrate.

Accordingly, the selection of a substrate on which an ALD film is to be formed is an important factor in view of the development of function. In the practice of the present invention, a laminate is formed in such a way that an overcoat layer made of an inorganic component containing transition metal atoms is formed, according to a sputtering process, on an ALD film serving as a functional layer formed on a substrate, and the relation between a water vapor transmission rate and a water vapor transmission rate after a resistance test has been checked.

Although it is generally considered that an ALD film is two-dimensionally grown on an electronic part substrate, an ALD film on an organic polymer substrate (e.g. PET: polyethylene terephthalate) is not actually grown two-dimensionally. In other words, with the formation of an ALD film on a polymer substrate by an ALD process, two-dimensional growth inherent to the ALD process cannot be realized. It is assumed that the main reasons for this reside in "the type of adsorption site" and "the density of the adsorption sites" and "the diffusion of a precursor toward a free deposition region" on a polymer substrate. For such reasons, it becomes important how to select an organic polymer substrate so as to efficiently form an ALD film.

With respect to the first reason of the density of the adsorption sites of a precursor in the ALD film, we consider as follows. A gaseous precursor (e.g. TMA: Trimethyl Aluminum) or a metal-containing precursor such as $TiCl_4$ is chemically adsorbed on the surface of a polymer substrate (which may be sometimes referred to merely as substrate hereinafter) to provide a first step of the ALD process. The reactivity between the precursor and a functional group (Functional Group) of the substrate and the density of the functional group greatly influence the chemical adsorption.

For example, with a polymer (polymer), the precursor of the ALD film is reversibly bonded to the polymer substrate in a manner as shown in the following chemical formula (1).

[Chem. 1]

(1)

In the formula (1), the OH group present in the polymer chain serves as a bonding site.

If the functional group is low in density, the bonding sites of the precursor are distributed in a sparse state. Where the bonding sites are in a sparse state, the ALD film grows three-dimensionally from the adsorption sites serving as nuclei. More particularly, if the density of the bonding sites is low, the ALD film grown from the precursor extends three-dimensionally and the precursor sparsely adsorbs on OH group-present portions, so that the ALD film columnly grows about the isolated nuclei. Thus, the ALD film cannot be formed efficiently, thus leading to difficulty in forming an ideal functional layer. For this, the selection of a substrate becomes important.

Embodiments

[Configuration of Laminate]

Figure 1:
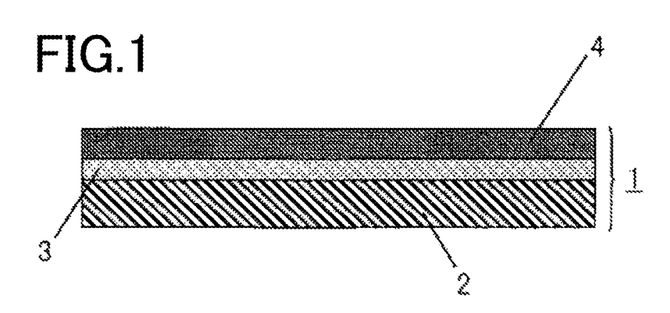
FIG. 1 is a schematic sectional view showing a configuration of a laminate related to an embodiment of the present invention.

FIG. 1 is a sectional view showing a configuration of a laminate according to an embodiment of the present invention.

As shown in FIG. 1, a laminate 1 includes a substrate 2 formed of a polymer material, a filmy or film-shaped functional layer 3 formed on the surface of the substrate 2 by an atomic layer deposition process, and an overcoat layer (OC layer) 4 formed on the functional layer 3 and made of an inorganic component. The functional layer 3 makes use of a precursor material as a starting material, for which an organometal material is ordinarily used. The precursor material is adsorbed on adsorption sites of the polymer substrate and reacts with a reactive gas to cause strong adhesion to the polymer substrate.

In order to adsorb the precursor material on the substrate 2 to efficiently form the functional layer 3, it is necessary to select a polymer material having a functional group, with which the precursor material is likely to be adsorbed. In addition, it is also necessary to select an organic polymer whose density of the functional groups, on which the precursor material is adsorbed, is high. Additionally, the substrate 2 may be subjected to surface treatment such as a plasma treatment, a hydrolysis treatment or the like so that the surface of the organic polymer is modified to form more dense OH groups. When an inorganic compound is added to the organic polymer, it becomes possible not only to increase the adsorption density of the precursor, but also to further improve the adhesion between the substrate 2 and the functional layer 3.

Here, the organic polymer having a functional group, with which the precursor of the functional layer 3 is susceptible to adsorption, is now described.

As to the material of the substrate 2, where polypropylene (PP) indicated by the following chemical formula (2) is used as a material of the substrate 2, there is no functional group capable of bonding with a precursor. Accordingly, even where the precursor is diffused throughout a free volume within the substrate 2, difficulty is involved in holding the precursor on or inside the substrate. Since the precursor cannot be bonded to the methyl group, PP is not a favorable organic polymer material for use as a substrate.

[Chemical Formula 2]

(2)

Where polyethylene terephthalate (PET) indicated by the following chemical formula (3) is used, the precursor can react with the oxygen atom of the ester bond, so that the precursor can remain on or inside the substrate. Accordingly, PET can be used as a substrate material. When the substrate made of PET is subjected to surface treatment such as plasma treatment or the like to decompose the ester bond thereby generating a hydroxyl group (—OH) and a carboxyl group (—COOH), the precursor can be more susceptible to adsorption.

[Chemical Formula 3]

$$\left[\begin{array}{c} \ddot{\text{O}}-\text{C}-\begin{array}{c}\phantom{X}\\ \phantom{X}\end{array}-\text{C}-\ddot{\text{O}}-(\text{CH}_2)_2 \\ \phantom{X}\underset{\text{O}}{\|} \phantom{XXXXXX} \underset{\text{O}}{\|} \end{array}\right]_n$$
(3)

Where the polyimide indicated by the following formula (4) is used as a substrate, a precursor material is able to react and bond with the imide and can efficiently remain on or inside the substrate. The precursor is very susceptible to adsorption with an imide, so that the polyimide is preferred as an organic polymer material used for the substrate.

[Chemical Formula 4]

(4)

Other instances of the functional group on which the precursor of the ALD film is likely to be adsorbed include nylon-6 having an amide group and represented by the following chemical formula (5), a polyether sulfone (PES) having a sulfonyl group and represented by the following chemical formula (6), and polyvinyl alcohol (PVA) having a hydroxyl group and represented by the following chemical formula (7).

[Chemical Formula 5]

(5)

-continued

[Chemical Formula 6]

(6)

[Chemical Formula 7]

(7)

More particularly, organic polymers used as a substrate are preferably those having an oxygen-containing functional group or a nitrogen-containing functional group. The functional group having an oxygen atom includes OH group, COOH group, COOR group, COR group, NCO group, $SO_3$ group or the like. The functional group having a nitrogen atom includes $NH_x$ group (wherein X is an integer). Besides, the functional group of an organic polymer used as a substrate may be one that contains an atom having an unshared electron pair or an unpaired electron and is capable of coordination bonding with a precursor, bonding through intramolecular forces (Van der Waals forces) or interaction through hydrogen bond or the like.

Aside from the organic polymers having structures of the above chemical formulas, there can be used polyvinyl alcohol, polyethylene imines, acrylic ester, urethane acrylic, polyester acrylic, polyether acrylic and phenolic resins, and polyether ketones, aliphatic polyketones, polybutylene terephthalate, polytrimethylene terephthalate and the like. Moreover, epoxy resins and acrylic resins having such functional groups as indicated above may also be used.

The precursor is supplied to the substrate of such an organic polymer as mentioned above, so that there are efficiently performed diffusion to and adsorption on the surface inside of the substrate and adsorption on the substrate surface, thereby leading to the formation of a desired functional layer 3.

[Fabrication Process of Laminate]

Figure 2:
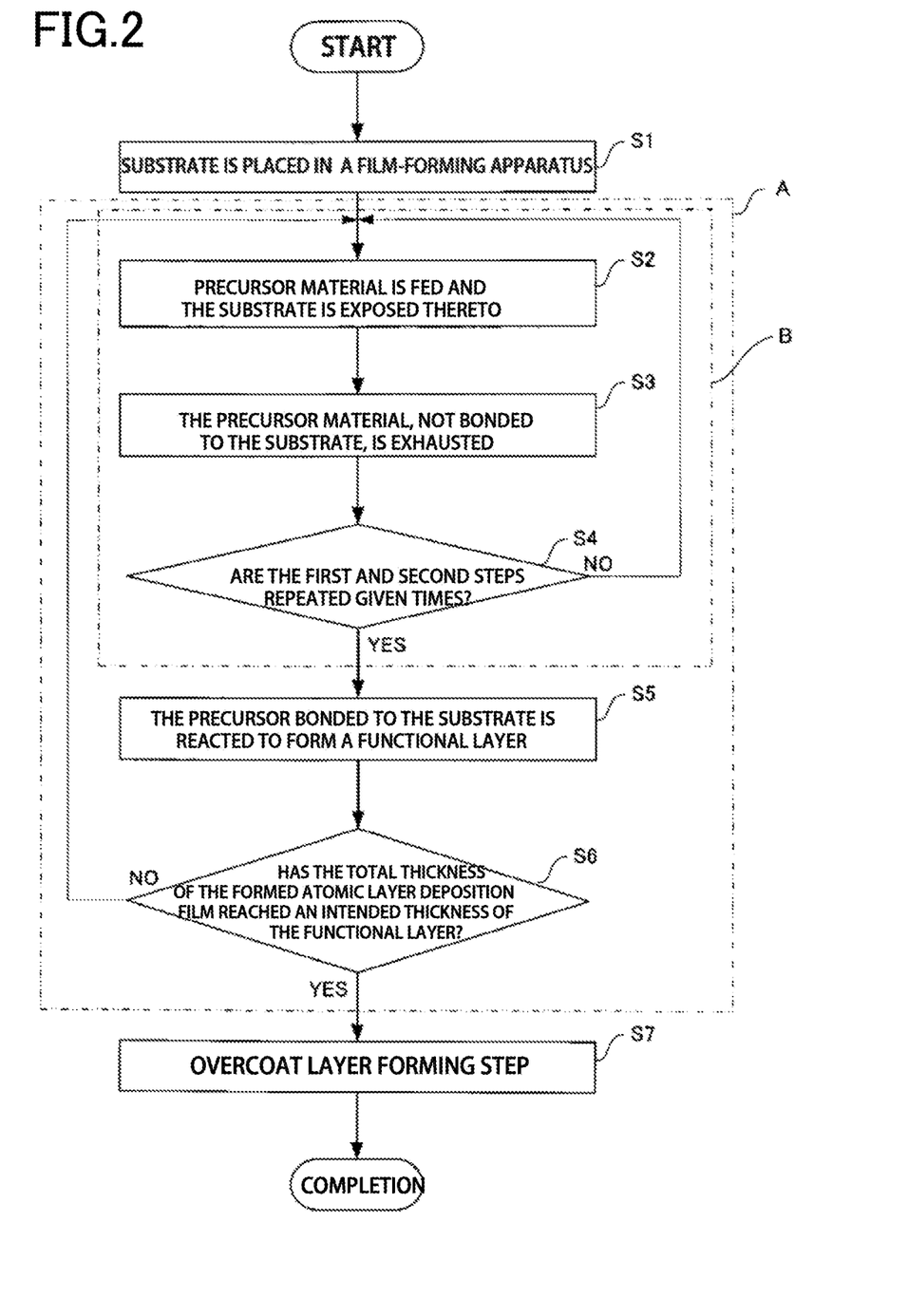
FIG. 2 is a flow chart schematically showing the steps of fabricating the laminate shown in FIG. 1.

FIG. 2 is a flow chart schematically showing the fabrication process of the laminate 1 shown in FIG. 1.

Initially, a substrate 2 made of an organic polymer is placed in a vacuum film-forming apparatus (such as a semiconductor manufacturing apparatus) (Step S1).

Next, a functional layer 3 is formed on the surface of the substrate 2 placed in the vacuum film-forming apparatus according to an atomic layer deposition process. In more detail, a precursor used as a starting material of an ALD film is exposed to the substrate 2 to permit crosslinking bond with a functional group present on the surface of the substrate (Step S2). Subsequently, the precursor material remaining on the surface without bonding with the functional group present on the surface of the substrate and the precursor material present in a film-forming chamber of the vacuum film-forming apparatus are both exhausted (Step S3). The manner of exhausting the precursor material includes a method of exhausting a precursor material in the film-forming chamber by use of a vacuum pump, and a method of feeding an inert gas, such as $N_2$, to the film-forming chamber while exhausting with a vacuum pump. Next, the step S2 and the step 3 are repeated given times (Step S4) so that the precursor material is bonded to the functional groups, not yet bonded to the precursor material, on the surface of the substrate 2 (Functional Layer Forming Step B). When this step is carried out, an ALD film grows two-dimensionally, with the possibility that a dense functional layer 3 can be formed. It will be noted that if necessary, the substrate 2 may be subjected to plasma treatment or hydrolysis treatment prior to the step S2. When these pre-treatments are carried out, the high density of the functional groups of an organic polymer can be realized.

Further, when the steps S2 to S4 are repeated, there is formed the functional layer 3 by reacting the precursor material bonded to the surface functional groups of the substrate 2 (Step S5). The formation of the functional layer 3 can be carried out by feeding a reactive gas into the film-forming chamber or by generating an excited plasma gas in the film-forming chamber. Next, the functional layer forming step B and the step S5 are repeated until the total thickness of the formed atomic layer deposition film arrives at an intended level (the number of cycles) of the functional layer (Step S6), thereby forming a functional layer having a predetermined thickness (Functional Layer Forming Step A).

Further, an overcoat layer 4 is formed on the surface of the thus formed functional layer 3 by a PVD process, a CVD process, or a vacuum deposition process (Step S7).

According to the steps of from Step S1 to Step S7, the overcoat layer 4 can be formed as a protective layer for the functional layer 3 formed by the atomic layer deposition method, so that the durability of the laminate 1 can be improved. Moreover, the formation of the overcoat layer 4 can lead to drastically improved characteristics in comparison with the case that the functional layer 3 is provided singly. Thus, the durability of the laminate 1 can be maintained at a higher level and thus, a gas barrier film of high reliability can be realized.

[Inorganic Film Used for Functional Layer]

Next, an inorganic film used as the functional layer 3 is illustrated. The functional layer 3 is an ALD film formed by an atomic layer deposition method. An organometal compound is used as a precursor material of the ALD film. Usable precursor materials for the ALD film include, for example, trimethyl aluminum (TMA), titanium tetrachloride ($TiCl_4$), tris(dimethylamino)silane (3DMAS) and bis(diethylamino)silane (BDEAS). Besides, there may be used precursor materials containing at least one of the elements of Group II, Group III, Group IV and Group V of the periodic table, transition metal elements, and lanthanoid elements. These precursor materials are oxidized with a reactive gas such as $H_2O$, $H_2O_2$ or the like. Alternatively, $O_2$, $N_2$, $CO_2$, $H_2$ or a mixed gas thereof is applied with a voltage to generate a plasma, followed by reaction with a precursor to form a metal film of the metal contained in the precursor material, an oxide film, a nitride film or an oxide nitride film thereby obtaining an ALD film. The thickness of the ALD film is preferably not less than 2 nm, more preferably not less than 5 nm in view of ensuring characteristics thereof. The number of repetitions of the film formation in the ALD process is preferably not less than 10 cycles, more preferably not less than 30 cycles in view of ensuring characteristics. Since the size and ratio of the free volume of the organic polymer, respectively, variously vary depending on the type of organic polymer substrate, the thickness of the ALD film and the number of repetitions of the film formation are not specifically limited regarding their lower limits and can thus be appropriately determined depending on the type of material for the substrate. Where the functional layer formed by use of such a precursor as indicated above is made, for example, of an oxide film, there may be used a film of $Al_2O_3$, $TiO_2$, $SiO_2$ or a mixed oxide, i.e., having a ternary composition such as $AlSi_xO_y$, $TiAl_xO_y$ or the like.

[Inorganic Film Used as OC Layer]

Next, the method of forming an overcoat layer formed on the functional layer 3 is illustrated. The overcoat layer is made of an inorganic film and can be formed by a variety of means capable of forming an inorganic film, such as a PVD process, a CVD process and the like. With the CVD process, limitation is placed on the type of organometal compound to be used and with the vacuum deposition process, the process and apparatus greatly influence the melting point of a material. In view of these facts, the sputtering process is preferred to form an overcoat layer. The film composition of the overcoat layer includes those of an oxide film, a nitride film or an oxide nitride film, each containing at least one transition metal element selected from elements of Group III, Group IV, Group V and lanthanoid elements. For example, where the overcoat layer is made of an oxide film, there may be used films of $Ta_2O_5$, $V_2O_5$, $Nb_2O_5$, $HfO_x$, $ZrO_x$ and a mixed oxide thereof.

Next, a method of fabricating a functional film by a roll-to-roll system is illustrated with reference to FIG. 3.

Figure 3:
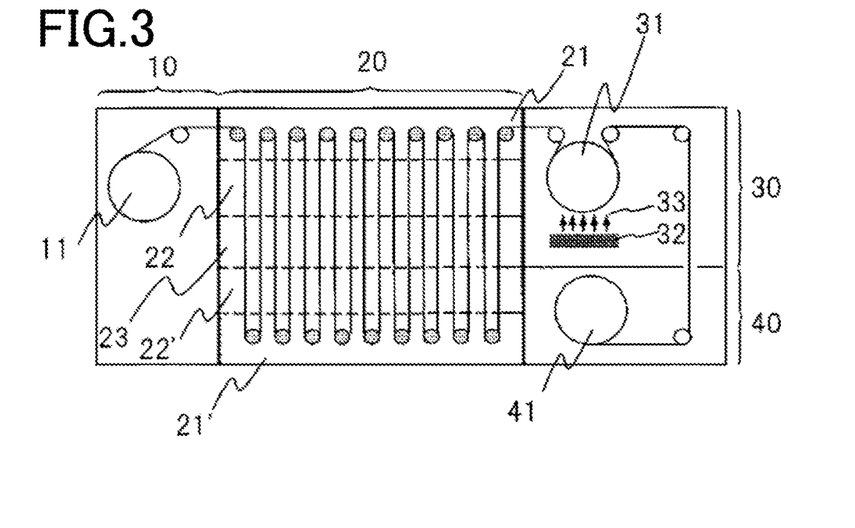
FIG. 3 is an illustrative view of a film-forming process using a roll-to-roll system.

FIG. 3 is an illustrative view of a film-forming process using a roll-to-roll system.

The film-forming apparatus shown in FIG. 3 includes an unwinding chamber 10 for feeding a starting substrate, a first film-forming chamber 20 for forming a functional layer, a second film-forming chamber 30 for forming an overcoat layer, and a winding chamber 40 for winding a finished functional film. The elongated substrate is transferred to the unwinding chamber 10, the first film-forming chamber 20, the second film-forming chamber 30 and the winding chamber 40 in this order thereby continuously forming the functional layer and the overcoat layer on the substrate.

The first film-forming chamber 20 includes, in parallel, precursor regions 21 and 21', into which a precursor material is introduced, purge regions 22 and 22' into which an inert gas is introduced, and a reaction region 23 wherein the precursor is reacted. As shown in FIG. 3, the precursor region 21, the purge region 22, the reaction region 23, the purge region 22' and the precursor region 21' are arranged in this order. While being folded back within the precursor regions 21 and 21', the substrate is passed in the order of precursor region→purge region→reaction region→purge region→precursor region.

Initially, a rolled substrate attached to an unwinding unit 11 of the unwinding chamber 10 is unwound and transferred to the first film-forming chamber 20 wherein an ALD film is formed. Next, the substrate is passed to the precursor region 21, into which a precursor used as a starting material for the atomic layer deposition film of the first film-forming chamber 20 is introduced. At this stage, the precursor is fed to the surface of the substrate and is bonded to the functional group present on the surface of the substrate. Next, the substrate having adsorbed the precursor thereon is passed through the purge region 22, into which an inert gas not reacting with the precursor, such as $N_2$ or Ar, has been introduced. On this occasion, an excess of the precursor, not bonded to the functional group of the precursor fed to the substrate, is purged with the inert gas.

Next, the substrate is passed through the reaction region 23, into which an oxidative gas is introduced and in which oxygen atom active species generated by plasma excitation are present. At this point of time, the precursor material bonded onto the substrate is reacted. Thereafter, the substrate is passed to the purge region 22', followed by transferring again to the precursor region 21'.

It will be noted that in the present embodiment, the substrate is passed through the precursor regions 21 (21') and the purge regions 22 (22'), once for each region, prior to the passage through the reaction region 23. Nevertheless, it is preferred that prior to the passage through the reaction region 23, the passages through the precursor regions 21 (21') and the purge regions 22 (22') are repeated. The repeated passages through the precursor regions 21 (21') and the purge regions 22 (22') enable an adsorption density of the precursor adsorbed on the substrate surface to be increased thereby making it possible to form a dense film.

When the substrate is repeatedly passed through the precursor regions 21 (21'), the purge regions 22 (22') and the reaction region 23 of the first film-forming chamber 20, the ALD film can be formed in a desired thickness.

The substrate on which the ALD film has been formed is transferred from the first film-forming chamber 20 and sent in the second film-forming chamber 30. Where the pressure between the first film-forming chamber 20 and the second film-forming chamber 30 differ from each other, a differential pumping mechanism may be provided between the first film-forming chamber 20 and the second film-forming chamber 30. Where the film-forming rate of the functional layer (ALD layer) and the film-forming rate of the overcoat layer differ from each other, a substrate storage unit may be provided between the first film-forming chamber 20 and the second film-forming chamber 30.

The substrate fed into the second film-forming chamber 30 is passed through a main roll 31 disposed in the second film-forming chamber 30 wherein a film composition 33 fed from a starting material feed unit 32 for overcoat layer is formed on the substrate as a film. If a sputtering process is used for the film formation in the second film-forming chamber 30, the starting material feed unit 32 becomes a sputtering target, and the film formation by reactive sputtering may be performed by introducing a reactive gas. Where a CVD process is used for the film formation in the second film-forming chamber 30, the starting material feed unit 32 becomes a precursor feed port and a CVD film can be formed by introducing a reactive gas. Moreover, where a vacuum deposition process is used for the film formation in the second film-forming chamber 30, the starting material feed unit 32 becomes a vacuum deposition source and a vacuum deposited film can be formed by heating or by irradiation of an ion beam. The overcoat layer containing an inorganic film can be formed according to any of the above processes.

The substrate, on which the overcoat layer has been formed, is transferred from the second film-forming chamber 30 and fed into a winding chamber 40 and wound around a winding unit 41 mounted in the winding chamber 40. A roll-shaped functional film can be obtained through the above steps.

EXAMPLES

Specific examples of the laminates of the present invention realized based on the foregoing embodiments are illustrated.

An ALD film serving as a functional layer and made of $Al_2O_3$ and a sputtered film of $Ta_2O_5$ used as an overcoat layer were stacked on a polymer substrate to form a functional film. The respective layers were formed in the following way.

[Method of Forming an $Al_2O_3$ Film]

An $AL_2O_3$ film (ALD film) was formed on at least one surface of a polymer substrate by an ALD process. On this occasion, a precursor gas used was trimethyl aluminum (TMA). Simultaneously with the precursor gas, $O_2$ and $N_2$ serving as process gases, $O_2$ and $N_2$ serving as purge gases, and $O_2$ serving as a reactive and plasma discharge gas were, respectively, supplied to the film-forming chamber. The treating pressure at this stage was set at 10 to 50 Pa. Moreover, a 13.56 MHz power supply was used as a power supply for plasma gas excitation. The plasma discharge was performed in ICP (Inductively Coupled Plasma) mode.

Prior to the formation of the ALD film, an $O_2$ plasma treatment was carried out as a pretreatment in order to increase the density of adsorption sites on the substrate surface. On this occasion, the flow rate of $O_2$ was set at 100 sccm, and the plasma discharge was generated in ICP mode. It will be noted that the output power of the plasma discharge was set at 300 watt and 60 seconds treatment was carried out.

The feeding times of the respective gases were 60 mseconds for the TMA and the process gas, 10 seconds for the purge gas, and 10 seconds for the reaction and discharge gas. The plasma discharge was generated in ICP mode simultaneously with the feed of the reaction and discharge gas. It will be noted that the output power of the plasma discharge at this time was set at 250 watts. The gas purge after the plasma discharge was such that $O_2$ and $N_2$ serving as the purge gases were fed at a flow rate of 100 sccm for 10 seconds, respectively. The film-forming temperature was set at 90° C.

The unit film-forming rate of $AlO_x$ under such cycle conditions as described above was about 1.4 Å/cycle. The film-forming treatment of 73 cycles was performed to form a film having a thickness of about 10 nm, for which the total film-forming time was about 60 minutes.

[Method of Forming an Overcoat Layer]

The lamination intermediate formed with the ALD film was mounted in a stage of a film-forming chamber of a sputtering apparatus. The pressure in the film-forming chamber was set at not large than $5.0 \times 10^{-4}$ Pa, after which Ar and $O_2$ were, respectively, introduced into the film-forming chamber at flow rates of 30 sccm and 10 sccm. The pressure in the film-forming chamber was maintained at $2.5 \times 10^{-1}$ Pa by adjusting an orifice at an exhaustion side. Next, a direct current voltage was applied between the stage and a target to form an overcoat layer by reactive sputtering. A Ta target was used as a sputtering target and the film formation was performed at a constant electric power of 300 watt. At that time, the voltage was 610V, the electric current was 0.51 A, a rotational speed of the stage was 6 r.p.m., and the distance between the target and the stage was 200 mm.

The film-forming rate of $Ta_2O_5$ under such conditions as indicated above was 10 nm/minute, so that the film formation was performed by appropriately setting a film-forming time so as to obtain a desired thickness of the overcoat layer.

The function of the resulting laminate film was evaluated using, as an index, a water vapor transmission rate (WVTR) prior to and after a durability test. The method of measuring a water vapor transmission rate and a durability testing method are, respectively, as follows.

[Method of Measuring a Water Vapor Transmission Rate]

Using MOCON Aquatran (registered trade name), manufactured by Modern Controls, Inc., as a water vapor transmission rate measuring device, a water vapor transmission rate of a sample was measured in an atmosphere of 40° C./90% RH. A laminate whose water vapor transmission rate was not larger than 0.02 [$g/m^2/day$] was subjected to measurement using Aquatran.

[Durability Test]

Using a PCT (Pressure Cooker Test) device (manufactured by ESPEC, Inc.) which is used as an accelerated life testing device, the durability test was conducted in such a way that a sample was introduced into an environment of 105° C./100% RH for 96 hours, followed by allowing to stand at a normal temperature for about 24 hours. The water vapor transmission rate of the sample after having been allowed to stand at a normal temperature was measured according to such a water vapor transmission rate measuring method as mentioned above to determine a water vapor transmission rate after the durability test.

With respect to the functional films related to Examples 1 to 4 and Comparative Examples 1 to 5, their forming conditions and water vapor transmission rates prior to and after the durability test are described below.

Example 1

In Example 1, a substrate made of a polyimide (PI) was used as a polymer substrate. A 10 nm thick ALD film made of $Al_2O_3$ was formed on the PI substrate as a functional layer. A $Ta_2O_5$ film was formed on the ALD film for 30 seconds by a sputtering process to form a 5 nm thick overcoat layer thereby obtaining a functional film of Example 1. The water vapor transmission rates (WVTR) of the resulting functional film were measured prior to and after the durability test and were found to be 0.01 [$g/m^2/day$] prior to the durability test and 1.03 g [$g/m^2/day$] after the durability test.

Example 2

In Example 2, a functional film was prepared under the same conditions as in Example 1 except that the film-forming time of the $Ta_2O_5$ film used in the sputtering process was set at 1 minute to form a 10 nm thick overcoat layer. The water vapor transmission rates (WVTR) of the resulting functional film were measured prior to and after the durability test and found to be 0.003 [$g/m^2/day$] prior to the durability test and 0.5 g [$g/m^2/day$] after the durability test.

Example 3

In Example 3, a functional film was prepared under the same conditions as in Example 1 except that the film-forming time of the $Ta_2O_5$ film used in the sputtering process was set at 2 minutes to form a 20 nm thick overcoat layer. The water vapor transmission rates (WVTR) of the resulting functional film were measured prior to and after the durability test and found to be 0.0006 [$g/m^2/day$] prior to the durability test and 0.1 g [$g/m^2/day$] after the durability test.

Example 4

In Example 4, a substrate made of polyethylene terephthalate (PET) was used as a polymer substrate. An ALD layer made of $Al_2O_3$ was formed on the PET substrate as a functional layer. A $Ta_2O_5$ film was formed by a sputtering process for 2 minutes to form a 20 nm thick overcoat layer thereby obtaining a functional film of Example 4. The water vapor transmission rate (WVTR) of the resulting functional film was measured prior to the durability test and found to be 0.0005 [$g/m^2/day$].

Comparative Example 1

In Comparative Example 1, a 10 nm thick ALD film made of $Al_2O_3$ was formed on a PI substrate as a functional layer. No $Ta_2O_5$ film serving as an overcoat layer was formed. The water vapor transmission rates of the resulting film prior to and after the durability test were measured and found to be 0.04 [$g/m^2$/day] prior to the durability test and 1.21 [$g/m^2$/day] after the durability test.

Comparative Example 2

In Comparative Example 2, a 5 nm thick $Ta_2O_5$ film was formed on a PI substrate without formation of a functional layer. The water vapor transmission rate of the resulting film prior to the durability test was measured and found to be 1.02 [$g/m^2$/day] which was substantially the same value as a water vapor transmission rate of the PI substrate alone which was 1.09 [$g/m^2$/day].

Comparative Example 3

In Comparative Example 3, a 10 nm thick $Ta_2O_3$ film was formed on a PI substrate without formation of a functional layer. The water vapor transmission rates of the resulting film prior to and after the durability test, were measured and found to be 0.59 [$g/m^2$/day] prior to the durability test and 0.91 [$g/m^2$/day] after the durability test.

Comparative Example 4

In Comparative Example 4, a 20 nm thick $Ta_2O_5$ film was formed on a PI substrate without formation of a functional layer. The water vapor transmission rates of the resulting film prior to and after the durability test were measured and found to be 0.49 [$g/m^2$/day] prior to the durability test and 0.76 [$g/m^2$/day] after the durability test.

Comparative Example 5

In Comparative Example 5, a substrate made of polypropylene (PP) was used as a polymer substrate. An ALD film made of $Al_2O_3$ was formed on the PP substrate as a functional layer. A $Ta_2O_5$ film was formed on the ALD film by a sputtering process for 2 minutes to form a 20 nm thick overcoat layer thereby obtaining a film related to Comparative Example 5. The thus obtained film was subjected to measurement of a water vapor transmission rate (WVTR) prior to the durability test, with a value of 0.30 [$g/m^2$/day].

In Table 1, the results of evaluation of Examples 1 to 4 and Comparative Examples 1 to 5 are shown.

| | Substrate | Functional layer (ALD film) Film thickness: 10 nm | Overcoat layer (Film thickness: 10 nm) | Initial WVTR ($g/m^2$/day) | After durability test WVTR ($g/m^2$/day) |
|---|---|---|---|---|---|
| Example 1 | PI | $Al_2O_3$ | $Ta_2O_5$ (5) | 0.01 | 1.03 |
| Example 2 | PI | $Al_2O_3$ | $Ta_2O_5$ (10) | 0.003 | 0.5 |
| Example 3 | PI | $Al_2O_3$ | $Ta_2O_5$ (20) | 0.0006 | 0.1 |
| Example 4 | PET | $Al_2O_3$ | $Ta_2O_5$ (20) | 0.0005 | — |
| Comparative Example 1 | PI | $Al_2O_3$ | nil | 0.04 | 1.21 |
| Comparative Example 2 | PI | nil | $Ta_2O_5$ (5) | 1.02 | — |
| Comparative Example 3 | PI | nil | $Ta_2O_5$ (10) | 0.59 | 0.91 |
| Comparative Example 4 | PI | nil | $Ta_2O_5$ (20) | 0.49 | 0.76 |
| Comparative Example 5 | PP | $Al_2O_3$ | $Ta_2O_5$ (20) | 0.30 | — |

As shown by the results of Examples 1 to 4, it has been confirmed that the water vapor transmission rates were remarkably lowered by forming the functional layer on the substrate by the ALD process and also forming the overcoat layer on the functional layer in comparison with the cases where the functional layer alone is formed on the substrate (Comparative Example 1) and where the $Ta_2O_5$ film alone is formed on the substrate (Comparative Examples 2 to 4). In Example 1 wherein the thickness of the overcoat layer is 5 nm, the gas barrier properties after the durability test, increase up to the same level of water vapor transmission rate as with the substrate. In Examples 2 and 3 wherein the thicknesses of the overcoat layers are, respectively, 10 nm and 20 nm, the water vapor transmission rates after the durability test are suppressed from increasing. Thus, it has been confirmed that when the thickness of the overcoat layer is made larger than 5 nm, the functional film can be suppressed from being deteriorated.

As will be seen from the comparison between Examples 3 and 4 and Comparative Example 5, where the propylene substrate, which cannot adsorb the precursor of the functional layer, was used, the water vapor transmission rate could not be adequately lowered even with the case that the overcoat layer is formed on the functional layer. Accordingly, it has been confirmed that it is important that functional groups (adsorption sites) capable of adsorbing a precursor be present on the substrate surface, on which an ALD film is stacked.

<Summary>

As stated hereinbefore, according to the laminate of the present invention, an atomic layer deposition film is formed on an organic polymer substrate, followed by forming an overcoat layer (OC layer) by a physical vapor phase growth process or a chemical vapor phase growth process. In doing so, the water vapor transmission rate can be remarkably lowered in comparison with the case using a functional layer alone, and the water vapor transmission rate after the durability test can be suppressed from being deteriorated to a level similar to that of a substrate.

The embodiments of the laminate related to the present invention have been set forth using water vapor transmission rates as an index with respect to its superiority and are described in detail with reference to the figures. The specific configuration of the present invention should not be construed as limited to the content of such embodiments as described before and changes in design without departing from the concept of the present invention should be made as included within the scope of the present invention. More particularly, the techniques described in the present invention is directed not only to a gas barrier laminate, but also to an inorganic film formed on an organic polymer substrate, for which emphasis should be placed on applicability to all types of laminates that are required to have durability against an environmental stress, such as high temperature, high humidity, exposure to light or the like, under which the functional layer mainly undergoes chemical changes and is deteriorated.

INDUSTRIAL APPLICABILITY

As will be seen from the above, the laminate of the present invention can be utilized not only for electronic parts such as electroluminescent devices (EL devices), liquid crystal displays, semiconductor wafers and the like, but also effectively as a packaging film of medicinal products, foods and the like and a packaging film of precision parts.

REFERENCE SIGNS LIST

1 Laminate; 2 Substrate; 3 Functional layer (ALD film); 4 Overcoat layer (OC layer); 10 Unwinding chamber; 11 Unwinding unit; 20 First film-forming chamber; 21, 21' Precursor regions; 22, 22' Purge regions; 23 Reaction region; 30 Second film-forming chamber; 31 Main roll; 32 Starting material feed unit; 33 Film composition

What is claimed is:

1. A method for fabricating a laminate comprising a substrate, a functional layer and an overcoat layer are stacked in this order, the method consisting of:

providing a substrate which contains an organic polymer having a functional group containing an oxygen atom or a nitrogen atom, feeding a precursor material of a functional layer onto a surface of the substrate, purging an inert gas to remove a portion of the precursor material not bonded to the surface of the substrate, forming the functional layer, which is an atomic layer deposition film by repeatedly reacting the precursor material; bonded to the surface of the substrate, with an oxidative gas by plasma excitation, and, forming an overcoat layer consisting of tantalum oxide, on the functional layer by a physical vapor phase growth method or a chemical vapor phase growth method, wherein the fabricated laminate consists of (a) the substrate, (b) the atomic layer deposition film and (c) the overcoat layer consisting of tantalum oxide.

2. The method of claim 1, wherein a thickness of the overcoat layer is from 5 to 1000 nm.

3. The method of claim 1, wherein a thickness of the overcoat layer is from 5 to 20 nm.

4. The method of claim 1, wherein the atomic layer deposition film is an $Al_2O_3$ atomic layer deposition film.

5. The method of claim 1, wherein the overcoat layer is formed by a physical vapor phase growth method.

6. The method of claim 1, wherein the overcoat layer is formed by sputtering.

* * * * *